(12) United States Patent
Naito et al.

(10) Patent No.: US 11,563,129 B2
(45) Date of Patent: Jan. 24, 2023

(54) PROCESS FOR PRODUCING ELECTRODE AND PROCESS FOR PRODUCING PHOTOELECTRIC CONVERSION DEVICE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Katsuyuki Naito, Bunkyo (JP); Naomi Shida, Minato (JP); Yutaka Saita, Yokohama (JP)

(73) Assignees: KABUSHIKIKAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 161 days.

(21) Appl. No.: 17/186,847

(22) Filed: Feb. 26, 2021

(65) Prior Publication Data
US 2021/0184127 A1 Jun. 17, 2021

Related U.S. Application Data

(63) Continuation of application No. PCT/JP2019/035558, filed on Sep. 10, 2019.

(51) Int. Cl.
*H05B 33/28* (2006.01)
*B32B 9/00* (2006.01)
(Continued)

(52) U.S. Cl.
CPC .......... *H01L 31/0224* (2013.01); *B32B 9/00* (2013.01); *B32B 15/02* (2013.01); *H01B 13/00* (2013.01);
(Continued)

(58) Field of Classification Search
CPC .......... B32B 9/00; B32B 15/02; H01B 13/00; H05B 33/28; H01L 51/0021;
(Continued)

(56) References Cited

U.S. PATENT DOCUMENTS 9,645,454 B2   5/2017 Naito et al.
2012/0114947 A1 5/2012 Jenninger et al.
(Continued)

FOREIGN PATENT DOCUMENTS

JP   2011-29035 A    2/2011
JP   2012-523359 A   10/2012
(Continued)

OTHER PUBLICATIONS

International Search Report dated Dec. 10, 2019 in PCT/JP2019/035558 filed Sep. 10, 2019 (with English Translation of Categories of Cited Documents and Written Opinion), 12 pages.
(Continued)

*Primary Examiner* — Daniel P Shook
(74) *Attorney, Agent, or Firm* — Oblon, McClelland, Maier & Neustadt, L.L.P.

(57) ABSTRACT

The embodiments provide a process for easily producing an electrode having low resistance, easily subjected to post-process and hardly impairing the device; and also provide, as its application, a production process for a photoelectric conversion device. The process comprises the steps of:
coating a hydrophobic substrate directly with a dispersion of metal nanomaterial, to form a metal nanomaterial layer,
coating the surface of the metal nanomaterial layer with a dispersion of carbon material, to form a carbon material layer and thereby to form an electrode layer comprising a laminate of the metal nanomaterial layer and the carbon material layer,
(Continued)

pressing the carbon material layer onto a hydrophilic substrate so that the surface of the carbon material layer may be directly fixed on the hydrophilic substrate, and peeling away the hydrophobic substrate so as to transfer the electrode layer onto the hydrophilic substrate.

20 Claims, 3 Drawing Sheets

(51) Int. Cl.
*B32B 15/02* (2006.01)
*H01B 13/00* (2006.01)
*H01L 51/52* (2006.01)
*H01L 31/0224* (2006.01)
*H01L 51/44* (2006.01)
*H01L 51/00* (2006.01)
*H01L 21/288* (2006.01)

(52) U.S. Cl.
CPC ........ *H01L 21/288* (2013.01); *H01L 51/0021* (2013.01); *H01L 51/442* (2013.01); *H05B 33/28* (2013.01); *H01L 51/5206* (2013.01); *H01L 51/5215* (2013.01); *H01L 51/5221* (2013.01); *H01L 51/5234* (2013.01); *H01L 2251/5338* (2013.01); *H01L 2251/5369* (2013.01)

(58) Field of Classification Search
CPC ............... H01L 51/442; H01L 51/5206; H01L 51/5215; H01L 2251/5369
See application file for complete search history.

(56) References Cited

U.S. PATENT DOCUMENTS

| | | |
|---|---|---|
| 2014/0272172 A1 | 9/2014 | Zhamu et al. |
| 2014/0272199 A1* | 9/2014 | Lin ..................... H01L 51/444 |
| | | 427/600 |
| 2019/0081190 A1 | 3/2019 | Naito et al. |
| 2019/0393416 A1 | 12/2019 | Naito et al. |

FOREIGN PATENT DOCUMENTS

| | | |
|---|---|---|
| JP | 2013-77435 A | 4/2013 |
| JP | 2014-200926 A | 10/2014 |
| JP | 5599980 B2 | 10/2014 |
| JP | 2015-173260 A | 10/2015 |
| JP | 2016-524517 A | 8/2016 |
| JP | 2017-91 875 A | 5/2017 |
| JP | 2019-50106 A | 3/2019 |
| WO | WO 2019/176078 A1 | 9/2019 |
| WO | WO 2019/176078 A1 | 4/2020 |

OTHER PUBLICATIONS

Arora, N. et al., "Perovskite solar cells with CuSCN hole extraction layers yield stabilized efficiencies greater than 20%," Science vol. 358, Nov. 10, 2017, 5 pages.

Madaria, A. R. et al., "*Uniform Highly Conductive, and Patterned Transparent Films of a Percolating Silver Nanowire Network on Rigid and Flexible Substrates Using a Dry Transfer Technique,*" Nano Res, vol. 3, DOI: 10.1007/S12274-010-0017-5, 2010, 10 pages.

Bae, S. et al., "Roll-to-roll production of 30-inch graphene films for transparent electrodes," Nature Nanotechnology, vol. 5, No. 8, DOI: 10.1038/NNANO.2010.132, Jun. 20, 2010, 6 pages.

\* cited by examiner

PROCESS FOR PRODUCING ELECTRODE AND PROCESS FOR PRODUCING PHOTOELECTRIC CONVERSION DEVICE

CROSS-REFERENCE TO RELATED APPLICATIONS

This application is based upon and claims the benefit of priority from the prior International Patent Application No. PCT/JP2019/035558, filed on Sep. 10, 2019, the entire contents of which are incorporated herein by reference.

FIELD

Embodiments of the present disclosure relate to a process for producing an electrode and also to a process for producing a photoelectric conversion device.

BACKGROUND

According to recent increasing of energy consumption, demand for alternative energy replacing fossil fuels has been rising as measures to cope with global warming. As a source of the alternative energy, solar cells have been attracted the attention and hence progressively developed. They are studied for various practical applications. From a practical viewpoint, it is particularly important to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility. For the purpose of producing flexible devices, flexible polymer materials are preferably employed. However, they are generally poor in heat resistance and hence devices are produced preferably by coating processes. Accordingly, materials for forming electrodes in the devices are also preferably suitable for coating processes. For example, dispersions of metal nanomaterials are practically employed. The metal nanomaterials are known to have various shapes, and those in nanowire shape are known to be suitably used for transparent electrodes. Those in nanowire shape are characterized in that light-transparency and electric resistance can be controlled by the coating amount thereof. On the other hand, those in granular shape and in planar shape are often used for non-transparent electrodes, and are particularly adopted when low resistance is necessary. However, if they contain silver, there may be problems in that the devices are impaired by diffusion of silver atoms and/or by reactions of silver with oxygen, halogen, sulfur and the like.

In contrast, electrodes formed by use of carbon materials are characterized in that the devices are scarcely impaired by diffusion of carbon atoms and/or by reactions thereof. However, they generally tend to have high electric resistance. They can be formed by processes in which underlying substrates are coated with dispersions of carbon materials. In that case, however, the dispersants may influence to impair the substrates and the devices. It is also known to combine silver nanowires with carbon materials, such as graphene and polymers, for producing transparent electrode films, which are then laminated to produce devices. However, depending on the polymers used as the underlying substrates, it is often difficult to further process the electrodes thus produced. It is still also known to produce an electrode by transferring a graphene film formed by CVD method. However, this process generally comprises many steps and further tends to cost a lot because it is necessary to form a sacrificial layer of copper foil.

DETAILED DESCRIPTION

The process for producing an electrode according to the embodiment, comprises the steps of:
  coating a hydrophobic substrate directly with a dispersion of metal nanomaterial, to form a metal nanomaterial layer,
  coating the surface of said metal nanomaterial layer with a dispersion of carbon material, to form a carbon material layer and thereby to form an electrode layer comprising a laminate of the metal nanomaterial layer and the carbon material layer,
  pressing said carbon material layer onto a hydrophilic substrate so that the surface of said carbon material layer may be directly fixed on the hydrophilic substrate, and
  peeling away said hydrophobic substrate so as to transfer said electrode layer onto said hydrophilic substrate.

Further, the process for producing a photoelectric conversion device according to the embodiment is a process for producing a photoelectric conversion device having a first electrode, a second electrode and a photoelectric conversion layer sandwiched therebetween, and comprises the steps of:
  preparing a composite in which said photoelectric conversion layer is formed on said second electrode,
  coating a hydrophobic substrate directly with a dispersion of metal nanomaterial, to form a metal nanomaterial layer,
  coating the surface of said metal nanomaterial layer with a dispersion of carbon material, to form a carbon material layer and thereby to form an electrode layer comprising a laminate of the metal nanomaterial layer and the carbon material layer,
  pressing said carbon material layer onto said photoelectric conversion layer so that the surface of said carbon material layer may be directly fixed on the photoelectric conversion layer, and
  peeling away said hydrophobic substrate so as to transfer said electrode layer onto said photoelectric conversion layer and thereby to form the first electrode layer.

Embodiments will now be explained with reference to the accompanying drawings.

[Embodiment 1]

Figure 1A:
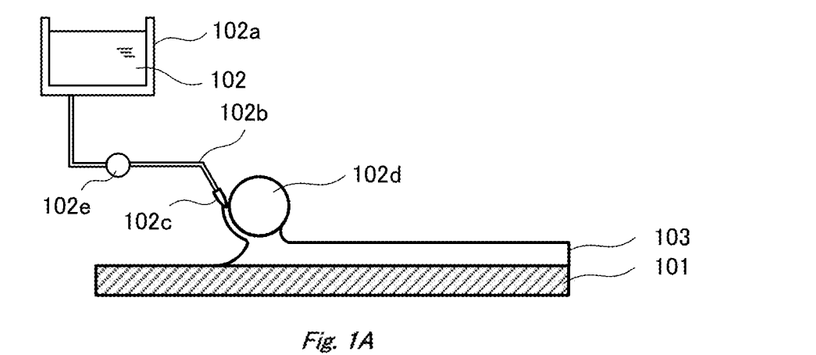
FIGS. 1A to 1D schematically illustrate a process for producing an electrode according to the embodiment.
Figure 1B:
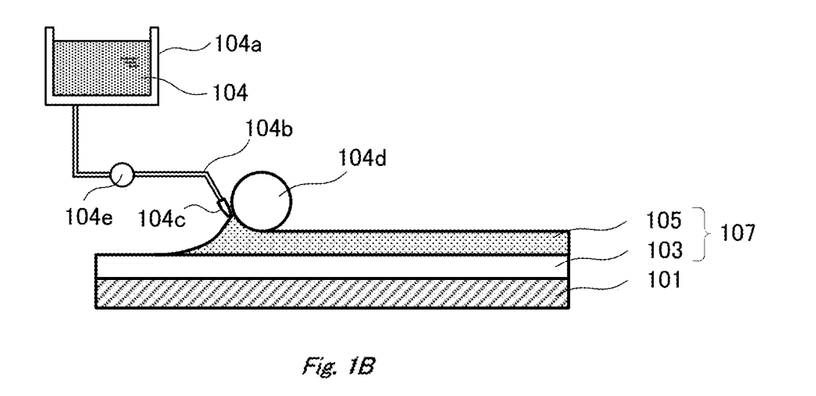
Figure 1C:
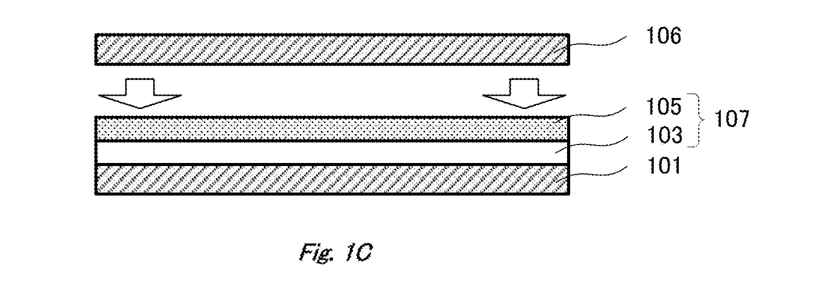
Figure 1D:
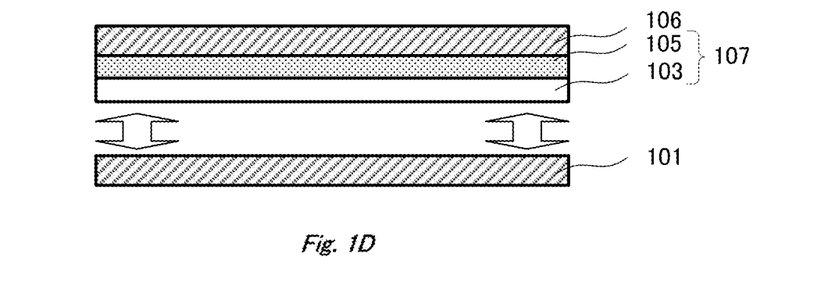

First, the process for producing a transparent electrode according to the first embodiment is explained with reference to FIG. 1. FIGS. 1A to 1D schematically illustrate the process for producing an electrode 100 according to the embodiment. This electrode production process comprises:

- a step A in which a hydrophobic polymer film (hydrophobic substrate) 101 is directly coated with a dispersion 102 containing metal nanomaterial, to form a metal nanomaterial layer 103 (FIG. 1A);
- a step B in which the metal nanomaterial layer 103 thus formed on the polymer film 101 is then coated with a dispersion 104 containing carbon material, to form a carbon material layer 105 and thereby to form an electrode layer 107 comprising the metal nanomaterial layer 103 and the carbon material layer 105 (FIG. 1B);
- a step C in which a hydrophilic substrate 106 is pressed and thereby fixed directly onto the surface of the carbon material layer (FIG. 1C); and
- a step D in which the electrode layer 107 is peeled from the polymer film 101 and thereby transferred onto the substrate 106 (FIG. 1D).

(Step A)

First, a hydrophobic substrate is prepared. The whole hydrophobic substrate does not need to be hydrophobic, as long as the substrate has a hydrophobic surface on which the metal nanomaterial layer is to be formed. This means that the hydrophobic substrate may be a support having a hydrophobic layer provided on the surface thereof. In FIG. 1A, the hydrophobic substrate is a hydrophobic polymer film 101. The hydrophobic surface of the substrate is directly coated with a dispersion 102 containing metal nanomaterial, to form a metal nanomaterial layer 103

The dispersion 102 is directly laid on the hydrophobic polymer film 101. In the embodiment, transferring is carried out by use of difference of hydrophilicity between the polymer film and the below-described hydrophilic substrate, and therefore the dispersion is directly applied on the polymer film 101. It is unnecessary in the embodiment to form a peeling layer or the like, which is generally used in known processes.

There are no particular restrictions on the method for applying the dispersion 102. For example, as shown in FIG. 1A, the dispersion is held between the polymer film 101 and a coating bar 102$d$, which is set apart from but parallel to the polymer film 101, and then the bar or the film is shifted. The gap between the polymer film and the bar can be controlled according to the materials of the polymer film and the dispersion and also to the kind of the bar. The dispersion may be supplied from a dispersion tank 102$a$ through a pipe 102$b$ and then injected from a nozzle 102$c$ into the gap between the film and the bar. The system may be equipped with a supply controller 102$e$, such as a pump, and the bar 102$d$ may fulfill a function of the nozzle.

In another way, the dispersion 102 may be spray-coated onto the polymer film 101. In that case, the dispersion may be sprayed from plural fixed nozzles or from one or a few nozzles moved reciprocatingly.

After formed by wet-coating, the metal nanomaterial layer 103 can be dried according to necessity. Specifically, the dispersion medium can be partly or fully removed by heating or decompression.

The polymer film 101 is hydrophobic. In the embodiment, "hydrophobic" means having a contact angle to pure water at 30° C. in a range of 80° or more, preferably 90° or more.

The polymer film is preferably made of material comprising a fluorine-containing polymer. Typical examples of the fluorine-containing polymer are fluorohydrocarbons, in which hydrogen atoms in hydrocarbons are partly or fully replaced with fluorine atoms. Among the fluorohydrocarbons, most preferred is a tetrafluoroethylene polymer in view of heat resistance, solvent resistance, and releasability. In addition, a polymer film made of tetrafluoroethylene polymer is easy to wash and hence that polymer is preferred also in view of repeating use. Examples of other fluorohydrocarbons include: homopolymers and copolymers of fluorine-containing monomers, such as, vinylidene fluoride and perfluoroalkyl vinylether; and copolymers of fluorine-containing monomers and hydrocarbons, such as, ethylene and polypropylene. Further, silicone resins are also employable as materials of the hydrophobic polymer. The polymer film may contain materials for enhancing the mechanical strength, such as, glass fibers, carbon fibers and other fillers.

Those polymers tend to be negatively charged. Accordingly, if also charged negatively, the metal nanomaterial is easily released and transferred from them. The electrification tendency can be estimated by measuring a zeta potential in water or an organic solvent, and the metal nanomaterial preferably has a lower potential than the polymer film. In consideration of the atmospheric environment containing carbon dioxide, the zeta potential in water at pH 6 is preferably adopted.

The zeta potential of the metal nanomaterial dispersion can be controlled by a dispersant contained in the dispersion and/or by a surface treatment agent of the metal nanomaterial, and those agents are preferably readily charged negatively. The zeta potential can be measured in a capillary cell by means of a Zetasizer Nano ZS ([trademark], manufactured by Malvern Instruments) according to the electrophoretic light scattering method. The pH value in water is controlled by adding diluted hydrochloric acid or diluted aqueous potassium hydroxide solution into pure water to which the dispersion is beforehand dropped in a small amount.

The zeta potential of the polymer film can be measured in a cell for flat-plate zeta potential measurement with tracer particles of polystyrene latex by means of a Zetasizer Nano ZS ([trademark], manufactured by Malvern Instruments) according to the electrophoretic light scattering method. The pH value in water is controlled by adding diluted hydrochloric acid or diluted aqueous potassium hydroxide solution into pure water.

The metal nanomaterial can have various shapes, such as, granular shape, planar shape, wire shape and rod shape. Among them, the wire-shaped metal nanomaterial is preferred because it can lower the electric resistance even in a small amount. Further, the wire-shaped metal nanomaterial makes it possible to form a transparent electrode. On the other hand, the granular-shaped or planar-shaped metal nanomaterial can be produced easily and hence can reduce the cost. Accordingly, when transparency is not important, the metal nanomaterial in granular or planar shape can be used in such a large amount as to form an electrode having extremely low resistance.

In the embodiment, there are no particular restrictions on the metal contained in the metal nanomaterial. However, in view of electroconductivity, cost and the like, the nanomaterial preferably comprises a metal selected from the group consisting of silver, silver alloys, copper and copper alloys, and it is particular preferred for the nanomaterial to comprise a silver alloy.

As the medium in the dispersion containing the metal nanomaterial, water, alcohols or mixtures thereof are employed. Among them, water is inexpensive and most preferred from the ecological viewpoint. However, if the dispersion medium consists of only water, it is generally difficult to coat the hydrophobic polymer film. Accordingly, in order to ease the coating procedure, it is preferred to carry out spray-coating in place of nozzle-coating while the hydrophobic polymer is kept at a high temperature.

When alcohols are adopted as the dispersion medium, the dispersion can be easily laid even on the hydrophobic polymer because having low surface tensions. The alcohols are preferably ones evaporating at relatively low temperatures, such as, methanol, ethanol, n-propanol, 2-propanol, n-butanol and mixtures thereof. Those alcohols can be mixed with water to prepare mixed dispersion media, which are also employable. The dispersion medium may contain a dispersant. Examples of the dispersant include: polymer compounds, such as, polyvinylpyrrolidone, polyvinyl alcohol and derivatives thereof; and low molecular weight compounds, such as, t-butoxyethanol and diethylene glycol mono-t-butyl ether.

When the metal nanomaterial is wire-shaped, a plural number of the metal nanowires are partly fused or in contact with each other to form a mesh-shaped or lattice-shaped network structure in the metal nanomaterial layer, and consequently electroconductive paths are produced to constitute an electroconductive cluster (percolation conduction theory). For constituting the electroconductive cluster, the nanowires need to lie in some number density. The longer the nanowires are, the more readily the conductive cluster is generally produced. In addition, the larger diameters the nanowires have, the larger the electroconductivity is. Thus, since the nanowires form a network structure, the layer as a whole shows high electroconductivity although containing the metal in a small amount. Specifically, the coating amount of the nanowires is normally 0.01 to 50 g/m$^2$. For example, the coating amount of the nanowires is preferably 0.05 to 50 g/m$^2$, more preferably 0.1 to 10 g/m$^2$, further preferably 0.15 to 1 g/m$^2$. Even if coated with the metal nanowires in the above density range, the resultant nanowire layer has the advantage of being flexible. In the other embodiment, the coating amount of the nanowires is preferably 0.01 to 20 g/m$^2$, more preferably 0.03 to 10 g/m$^2$, further preferably 0.05 to 1 g/m$^2$. Even if coated with the metal nanowires in the above density range, the resultant nanowire layer has the efficient conductivity.

The wire-shaped metal nanomaterial normally comprises metal nanowires having diameters of 10 to 500 nm and lengths of 0.1 to 50 μm. The diameters and lengths of the metal nanowires can be determined, for example, by analyzing a SEM image selected with a scanning electron microscope (SEM).

If having too small diameters, the nanowires in themselves tend to have large electrical resistance. On the other hand, if the diameters are too large, light-scattering or the like may increase to reduce the transparency. In view of that, the nanowires have diameters of preferably 20 to 150 nm, more preferably 30 to 120 nm.

If the nanowires have too short lengths, the conductive cluster may be formed so insufficiently that the resistance tends to increase. On the other hand, if having too long lengths, the nanowires are often unable to disperse stably in producing an electrode or the like. In view of that, the nanowires have lengths of preferably 1 to 40 μm, more preferably 5 to 30 μm.

The nanowires can be produced in any manner. For example, silver nanowires can be obtained by reducing an aqueous solution of silver ions with various reducing agents. The shapes and sizes of the silver nanowires can be controlled by selecting the kinds of the reducing agent, protective polymer or dispersant, and coexistent ions. In producing silver nanowires, it is preferred to adopt a polyhydric alcohol, such as ethylene glycol, as the reducing agent and polyvinylpyrrolidone as the protective polymer. From those materials, what is called "nanowires" of nano-order size can be obtained. In the embodiment, "silver nanowires" includes nanowires of silver alloys.

The metal nanowire dispersion can also contain metal nanoparticles. For example, the dispersion of silver nanowires may contain silver nanoparticles. Because readily aggregating with the silver nanowires, the silver nanoparticles serve as an adhesive favorably combining the silver nanowires with each other, and as a result, they fulfil a function of reducing electrical resistance of the layer as an electroconductive film.

(Step B)

Then, the surface of the metal nanomaterial layer 103 formed in Step A is directly coated with a dispersion 104 containing carbon material, to form a carbon material layer 105 and thereby to obtain an electrode layer 107 comprising a laminate of the metal nanomaterial layer and the carbon material layer.

The carbon material is preferably selected from the group consisting of graphene, graphite, carbon nanotubes, carbon nanofibers, carbon nanohorns, and ketjen black. Among them, graphene is particularly preferred because it prevents substances generated in the photoelectric conversion layer or the like from oozing out and thereby shields the metal nanomaterial and the underlayer from deterioration. As the graphene, graphite-exfoliated graphene or reduced-type graphene oxide is preferably adopted. When the electrode to be produced is allowed to have low transparency, graphite-exfoliated multilayer graphene is preferably employed as the graphene. The layer of multilayer graphene preferably has a thickness of 5 to 1000 nm. On the other hand, when it is necessary to produce an electrode having high transparency, reduced-type graphene oxide is preferably employed. It is more preferred that polyethyleneimine chains are connected to the reduced-type graphene oxide because such graphene oxide is excellent in dispersibility. In place of the layer of reduced-type graphene oxide, the layer of graphene oxide can be formed by wet-coating. In that case, however, the formed graphene oxide layer is then reduced with hydrazine hydrate vapor so as to be converted into the layer of reduced-type graphene oxide. Further, when the electrode is produced to have high transparency, carbon nanotubes can be adopted in place of graphene. They enable the electrode to have lower resistance than that produced by use of graphene, and hence are preferred. However, in view of keeping the prevention against oozing of the substances sufficiently, graphene is preferably employed.

When the electrode is produced to have high transparency by use of graphene, the carbon material layer preferably has a layered structure comprising one to four monomolecular layers of graphene (hereinafter, referred to as "graphene monolayers") on average. The graphene is preferably unsubstituted graphene; nitrogen-doped graphene, in which carbon atoms in the graphene skeleton are partly replaced with nitrogen atoms; or boron-doped graphene, in which carbon atoms in the graphene skeleton are partly replaced with boron atoms. The graphene skeleton is generally constituted with six-membered carbon rings, but may partly include five- and/or seven-membered carbon rings. Among them, unsubstituted graphene and boron-doped graphene are suitable for positive electrode material, and nitrogen-doped graphene is suitable for negative electrode material. The nitrogen-doped amount (N/C atomic ratio) can be determined by XPS, and is preferably 0.1 to 30 atom %, more preferably 1 to 10 atom %. Since containing nitrogen atoms, the nitrogen-doped graphene layer has high acid- and ion-trapping ability and accordingly shows high shielding effect.

As the medium in the dispersion 104 containing the carbon material, various solvents can be used. Examples thereof include water, alcohols, dimethylformamide, methyl ethyl ketone, chlorobenzene, and mixtures thereof. For coating the metal nanomaterial layer, the dispersion medium can be selected from a wide range of solvents. Among them, water is inexpensive and most preferred from the ecological viewpoint.

The carbon material-containing dispersion 104 can be applied to form a coat, for example, in the following manner. The dispersion 104 is held between the metal nanomaterial layer and a bar 104d, which is set apart from but parallel to the metal nanomaterial layer, and then the bar or the metal nanomaterial layer is shifted. The gap between the metal nanomaterial layer and the bar can be controlled according to the materials of the metal nanomaterial layer and the dispersion and also to the kind of the bar. The dispersion may be supplied from a dispersion tank 104a through a pipe 104b and then injected from a nozzle 104c into the gap between the metal nanomaterial layer and the bar. The system may be equipped with a supply controller 104e, such as a pump, and the bar 104d may fulfill a function of the nozzle. Thus, the dispersion can be injected from the nozzle into the gap between the film and the bar, or otherwise can be applied by means of the bar capable of serving as the nozzle, so as to coat the metal nanomaterial layer. Even if it is difficult for the dispersion to directly coat the hydrophobic substrate, the metal nanomaterial layer can be often easily coated with the dispersion.

After formed by wet-coating, the carbon material layer 105 can be dried according to necessity. Specifically, the dispersion medium can be partly or fully removed by heating or decompression.

If necessary, a layer of a third material can be formed on the carbon material layer. The third material is, for example, a substance for enhancing adhesion with the hydrophilic substrate to be transferred thereon or a substance fulfilling an electronic function such as electron transporting or hole transporting.

(Step C)

Subsequently, a hydrophilic substrate 106 is directly press-bonded onto the surface of the carbon material layer 105 formed in Step B. This press-bonding step gives a temporal stack comprising the hydrophobic substrate, the metal nanomaterial layer, the carbon material layer and the hydrophilic substrate. Here, the hydrophilic substrate needs to have a surface of higher hydrophilicity than the polymer film serving as the hydrophobic substrate. This means that "hydrophobic substrate" and "hydrophilic substrate" are relative terms. Accordingly, for example, even a water-repelling substrate such as a PET film, which is generally regarded as a hydrophobic substrate, can be occasionally adopted as the hydrophilic substrate. In the embodiment, the electrode layer 107 comprising the metal nanomaterial layer 103 and the carbon material layer 105 is transferred by use of difference of hydrophilicity between the polymer film and the hydrophilic substrate, and hence it is unnecessary to provide an adhesive layer, which is generally used in known processes, on the surface of the hydrophilic substrate.

There are no particular restrictions on the pressure applied in the press-bonding step. However, the step is carried out in order that the carbon material layer and the hydrophilic substrate may adhere closely without gaps to form a stack, and accordingly it is unnecessary to apply excess pressure.

The hydrophilic substrate 106 may be an insulating substrate of various polymers or ceramics. The insulating substrate may have a surface provided with an electro-conductive film made of transparent electroconductive metal oxide, such as, indium-tin oxide (ITO), aluminum-doped zinc oxide (AZO), tin oxide, vanadium-doped titanium; or of electroconductive polymer such as PEDOT:PSS. The hydrophilic substrate is preferably a flexible substrate, such as a polymer film, so that the produced electrode or a device comprising the electrode may be flexible.

In the step shown in FIG. 1C, the layer is directly press-bonded onto the substrate with, for example, a flat-plate pressing machine. Specifically, the hydrophobic substrate provided with the metal nanomaterial layer and the carbon material layer formed thereon is fixed on a bolster plate of the pressing machine while the hydrophilic substrate is fixed on a slide, so that the hydrophilic substrate can be press-bonded onto the carbon material layer.

(Step D)

Thereafter, the carbon material layer is peeled from the polymer film, and transferred onto the substrate. In the step shown in FIG. 1D, the procedure is carried out by applying pressure in the direction opposite to that applied for press-bonding.

Specifically, if the press-bonding is carried out with the pressing machine in the above manner, the slide is moved in the direction for separating from the bolster plate.

As a result, the electrode layer is transferred onto a relatively highly hydrophilic surface of the hydrophilic substrate, to form an electrode. If only formed on the surface of the hydrophobic substrate, the carbon material layer is often hard to peel off. However, since the metal nanomaterial layer is formed thereunder, it is often the case that the carbon material layer can be easily peeled off.

Although FIGS. 1C and D illustrate the press-bonding and peeling procedures on a flat plate, it is possible to adopt, for example, a roll-to-roll process in which those procedures are continuously carried out between two rollers.

(Optional Additional Steps)

The production process may further comprise, after the electrode layer is transferred onto the hydrophilic substrate, a step in which an auxiliary metal wiring is formed on the surface of the transferred electrode layer. The auxiliary metal wiring is generally used for collecting currents in the device. The auxiliary metal wiring is preferably made of a material selected from the group consisting of silver, gold, copper, molybdenum, aluminum and alloys thereof. The auxiliary metal wiring may be partly in contact with the metal nanomaterial layer or with the hydrophilic substrate so as to enhance the adhesion therebetween. The auxiliary metal wiring layer can be in the shape of lines, combs, meshes or the like.

Figure 2:
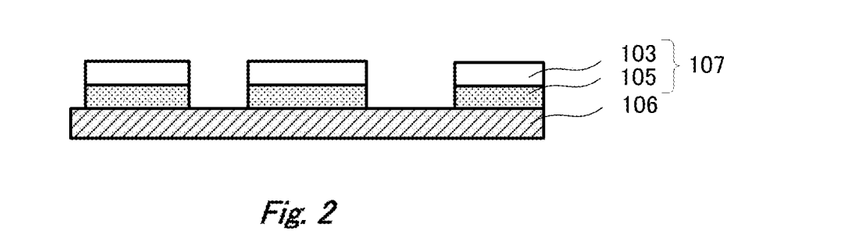
FIG. 2 is a schematic sectional view illustrating a step in which a metal nanomaterial layer and a carbon material layer are processed after they are transferred according to the embodiment.

Further, as shown in FIG. 2, the metal nanomaterial layer 103 and/or the carbon material layer 105 may be subjected to patterning. For the patterning treatment, mechanical scribing and laser scribing are suitable. This treatment makes it possible to produce electrodes applicable to various devices.

[Embodiment 2]

The second embodiment relates to a process for producing a photoelectric conversion device having a first electrode, a second electrode and a photoelectric conversion layer sandwiched therebetween. This process comprises the steps of:
preparing a composite in which the photoelectric conversion layer is formed on the second electrode,
coating a hydrophobic substrate directly with a dispersion of metal nanomaterial, to form a metal nanomaterial layer,
coating the surface of the metal nanomaterial layer with a dispersion of carbon material, to form a carbon material layer and thereby to form an electrode layer comprising a laminate of the metal nanomaterial layer and the carbon material layer,
pressing the carbon material layer onto the photoelectric conversion layer so that the surface of the carbon material layer may be directly fixed on the photoelectric conversion layer, and
peeling away the hydrophobic substrate so as to transfer the electrode layer onto the photoelectric conversion layer and thereby to form the first electrode layer.

In contrast to the first embodiment in which the electrode layer is transferred onto the hydrophilic substrate, the second embodiment is characterized in that the electrode layer is transferred onto the photoelectric conversion layer. In other words, in the second embodiment, the procedures of the first embodiment can be repeated except that the electrode layer is transferred onto the photoelectric conversion layer so as to form the first electrode.

The second electrode can be formed in the same manner as in the first embodiment. In that case, the substrate on which the second electrode is formed in a manner similar to the first embodiment is preferably a support suitable for supporting the photoelectric conversion device. Examples thereof include glass substrates, silicon substrates, and polymer films.

As the second electrode, any electrode can be adopted. Examples thereof include: electrodes of metals, such as, silver, copper, aluminum, and alloys thereof; electrodes of metal oxides, such as, indium-tin oxide (ITO), aluminum-doped zinc oxide (AZO), tin oxide, vanadium-doped titanium; and organic conductive films of electroconductive polymers, such as, PEDOT:PSS.

The photoelectric conversion layer may be either a layer generating electric power by absorbing light or a layer emitting light by consuming electric power. Embodiment thereof are explained below.

[Embodiment 2-1]

Figure 3:
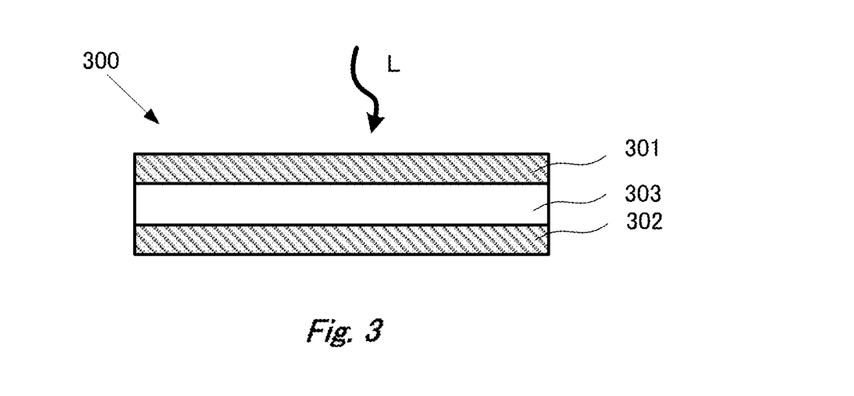
FIG. 3 is a schematic sectional view showing the structure of a solar cell produced according to the embodiment.

The structure of a solar cell 300, which is a photoelectric conversion device produced according to the embodiment, is schematically explained below with reference to FIG. 3. The solar cell 300 is a device functioning as a solar cell in which light energy of sunlight L and the like coming into the cell is converted into electric power. The solar cell 300 has a transparent electrode 301, a counter electrode 302, and a photoelectric conversion layer 303. At least one of the transparent and counter electrodes comprises a laminate structure of a metal nanomaterial layer and a carbon material layer, and the laminate structure is produced according to the embodiment. The counter electrode may be either transparent or nontransparent.

The photoelectric conversion layer 303 contains semiconductors which convert photoenergy of incident light into electric power and thereby which generate electric currents. The conversion layer 303 generally comprises a p-type semiconductor layer and an n-type one. The photoelectric conversion layer may be of a laminate of p-type polymer and n-type substance; of a perovskite type represented by $ABX_3$ (where A, B and X are a monovalent cation, a divalent cation and a halogen ion, respectively); of a silicon semiconductor; of an inorganic compound semiconductor, such as, InGaAs, GaAs, chalcopyrite and the like, CdTe and the like, InP and the like, or SiGe and the like; $Cu_2O$ and the like, of a quantum dot-containing type; or of a dye-sensitized transparent semiconductor. Any of them can achieve high efficiency and reduce deterioration of output power.

For the purpose of promoting or blocking electron injection, there may be a buffer layer and the like between the photoelectric conversion layer 303 and the electrode.

The buffer or charge transporting layer for the positive electrode can be made of, for example, vanadium oxide, PEDOT/PSS, p-type polymer, vanadium pentoxide ($V_2O_5$), 2,2',7,7'-tetrakis[N,N-di(4-methoxyphenyl)amino]-9,9'-spirobifluorene (hereinafter, referred to as "Spiro-OMeTAD"), nickel oxide (NiO) or molybdenum trioxide ($MoO_3$).

On the other hand, the buffer or charge transport layer for the negative electrode can be made of, for example, lithium fluoride (LIF), calcium (Ca), 6,6'-phenyl-C61-butyric acid methyl ester (C60-PCBM), 6,6'-phenyl-C71-butyric acid methyl ester (hereinafter, referred to as "C70-PCBM"), indene-C60 bisadduct (hereinafter, referred to as "ICBA"), cesium carbonate ($Cs_2CO_3$), titanium dioxide ($TiO_2$), poly [(9,9-bis(3'-(N,N-dimethylamino) propyl-2,7-fluorene)-alt-2,7-(9,9-dioctyl-fluorene)] (hereinafter, often referred to as "PFN"), bathocuproine (hereinafter, often referred to as "BCP"), zirconium oxide (ZrO), zinc oxide (ZnO), tungsten trioxide ($WO_3$) or polyethyleneimine.

The photoelectric conversion device produced according to the embodiment can be used not only as a photocell or a solar cell but also as a photosensor. The device can be applied to light selected from a wide wavelength range from infrared to ultraviolet or γ-rays.

The process of the embodiment for producing a photoelectric conversion device can further comprise a step for forming a UV-cut layer or a gas-barrier layer. Examples of ultraviolet absorbers contained in the UV-cut layer include: benzophenones, such as, 2-hydroxy-4-methoxybenzophenone, 2,2-dihydroxy-4-methoxy-benzophenone, 2-hydroxy-4-methoxy-2-carboxybenzophenone, and 2-hydroxy-4-n-octoxybenzophenone; benzotriazoles, such as, 2-(2-hydroxy-3,5-di-t-butylphenyl)benzotriazole, 2-(2-hydroxy-5-methyl-phenyl)benzotriazole, and 2-(2-hydroxy-5-t-octylphenyl)-benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be a super-thin glass sheet. There are no particular restrictions on the thickness of the gas-barrier layer, but the thickness is preferably 0.01 to 3000 μm, more preferably 0.1 to 100 μm. If having a thickness of less than 0.01 μm, the layer tends to have insufficient gas-barrier ability. On the other hand, if having a thickness of more than 3000 μm, the layer tends to be so thick as to lose flexibility and the like. The gas-barrier layer has a water-vapor permeability (moisture permeability) of preferably $10^2$ to $10^{-6}$ g/m²·d, more preferably 10 to $10^{-5}$ g/m²·d, further preferably 1 to $10^{-4}$ g/m²·d. The moisture permeability can be measured according to JIS Z0208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition thereof; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

As for the substrate used in the process of the embodiment for producing the device, a transparent substrate can be made of, for example, inorganic materials such as glass or organic materials such as PET, PEN, polycarbonate and PMMA. It is also possible to adopt aluminum foil and SUS foil. The substrate is preferably made of flexible materials because it makes the resultant photoelectric conversion device of the embodiment rich in flexibility.

In the present embodiment, if necessary, the photoelectric conversion layer can be formed on the carbon material layer and then transferred onto the counter electrode.

[Embodiment 2-2]

Figure 4:
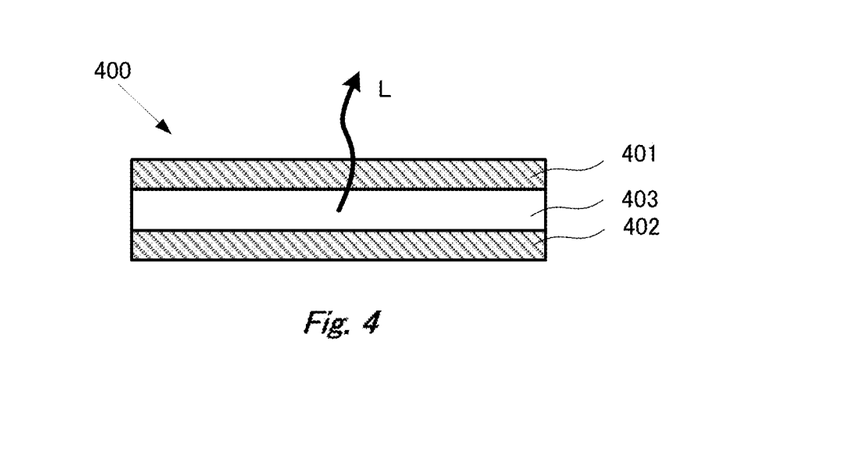
FIG. 4 is a schematic sectional view showing the structure of an organic EL device produced according to the embodiment.

With reference to FIG. 4, the structure of another photoelectric conversion device (organic EL device 400) produced according to the embodiment is schematically explained. The organic EL device 400 is a device functioning as a light-emitting device in which inputted electric energy is converted into light.

The organic EL device 400 has a transparent electrode 401, a counter electrode 402, and a photoelectric conversion layer 403. At least one of the transparent and counter electrodes comprises a laminate structure of a metal nanomaterial layer and a carbon material layer, and the laminate structure is produced according to the embodiment. The counter electrode may be either transparent or nontransparent.

The photoelectric conversion layer 403 is a semiconductor layer in which electric power is converted to generate light. The conversion layer 403 generally comprises a p-type semiconductor layer and an n-type one. For the purpose of promoting or blocking electron injection, there may be a buffer layer between the photoelectric conversion layer 403 and the electrode.

The embodiments are further explained by the following examples.

EXAMPLE 1

An ITO layer is formed by sputtering on a 10-cm square piece of polyethylene terephthalate (PET) film, to produce an electroconductive film (hydrophilic substrate) having a surface resistance of 300Ω/square.

Meanwhile, silver nanowires having a diameter of 70 nm are dispersed in water, to prepare a 0.3 wt % dispersion. The aqueous silver nanowire dispersion is spray-coated on a 10-cm square piece of polytetrafluoroethylene (PTFE) film (hydrophobic substrate) of 100 μm thickness placed on a stage heated at 120° C., to form a metal nanomaterial layer. The zeta potentials in water at pH 6 of the PTFE film and the silver nanowires are −17 mV and −30 mV, respectively.

The layer of silver nanowires is then bar-coated at room temperature with an ethanol dispersion of reduced-type graphene oxide in which polyethyleneimine chains are connected, to form a carbon material layer.

The above layer of graphene and the ITO layer on the hydrophobic substrate are so laminated that the graphene layer may be faced onto the ITO layer, to produce a stack on the stage heated at 100° C. After a metal plate is placed on the stack, the stack is directly press-bonded. Subsequently, the PET film is peeled off from the edge so as to transfer the laminate of the silver nanowire layer and the graphene layer onto the ITO layer.

As a result, the silver nanowire layer and the graphene layer are almost completely transferred, to obtain a transparent electrode having a surface resistance of 10Ω/square.

EXAMPLE 2

Silver nanowires having a diameter of 30 nm are dispersed in 2-propanol, to prepare a 1 wt % dispersion. After a 10-cm square piece of PTFE film (hydrophobic substrate) of 100 μm thickness is placed on a stage heated at 60° C., the silver nanowire dispersion is held between the PTFE film and a columnar bar of 5 mm diameter (gap: 500 μm). The dispersion forms a meniscus between the PTFE film and the bar. The bar is then moved at a speed of 83 mm/second, to spread the silver nanowire dispersion on the PTFE film surface and thereby to form a silver nanowire layer (metal nanomaterial layer).

The silver nanowire layer is then bar-coated at room temperature with a 2-propanol dispersion of graphite-exfoliated multilayer graphene, to form a carbon material layer.

The above layer of graphene and a PET film of 100 μm thickness is laminated on a stage heated at 120° C. to form a stack, on which a metal roller is then rolled from the edge so as to directly press-bond the stack. Successively, the PTFE film is peeled away to transfer the silver nanowire layer and the graphene layer onto the PET film.

As a result, the silver nanowire layer and the graphene layer are almost completely transferred, to obtain an electrode having a surface resistance of 0.3Ω/square.

EXAMPLE 3

Figure 5:
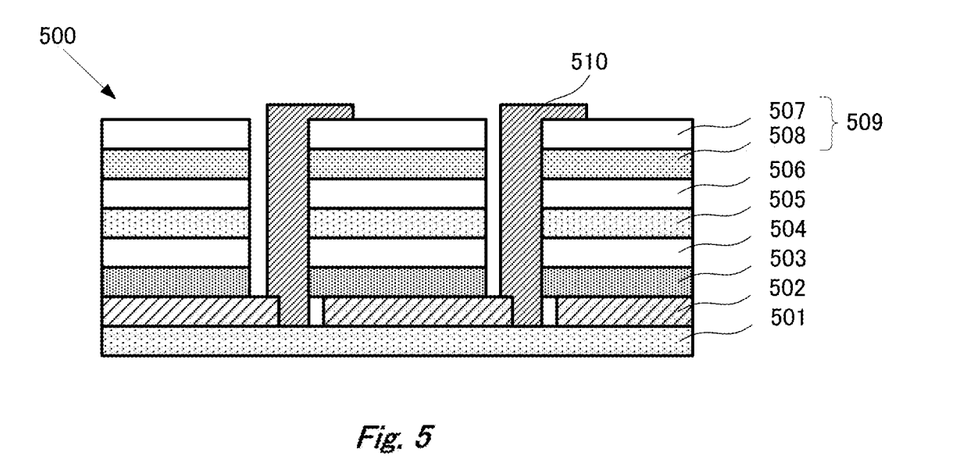
FIG. 5 is a schematic sectional view showing the structure of the solar cell produced in Example 3.

A semi-transparent solar cell 500 shown in FIG. 5 is produced.

The surface of an ITO layer 502 formed on a PET film 501 is subjected to patterning with an acid, to form a strip-shaped transparent electrode. The electrode is then coated with an aqueous solution of graphene oxide by means of a bar-coater to form a graphene oxide layer. After dried at 90° C. for 20 minutes, the graphene oxide layer is treated with hydrated hydrazine vapor at 110° C. for 1 hour and thereby converted into a barrier layer 503 comprising an averagely-bilayer N-graphene layer in which carbon atoms in reduced graphene oxide are partly replaced with nitrogen atoms.

The barrier layer 503 is then coated with an aqueous solution of PEDOT·PSS by means of a bar-coater, and dried at 100° C. for 30 minutes, to form a buffer layer 504 (thickness: 50 nm) containing PEDOT·PSS.

Subsequently, the buffer layer 504 is coated with a chlorobenzene solution containing poly(3-hexylthiophene-2,5-diyl) (P3HT) and C60-PCBM by means of a bar-coater, and dried at 100° C. for 20 minutes, to form a photoelectric conversion layer 505.

Further, the photoelectric conversion layer 505 is coated with an ethanol dispersion of tin oxide nanoparticles by means of a bar-coater, and dried to form a buffer layer 506.

Meanwhile, silver nanowires having a diameter of 70 nm are dispersed in water, to prepare a 0.3 wt % dispersion. The aqueous silver nanowire dispersion is spray-coated on a 10-cm square piece of 100 μm-thick PTFE film (hydrophobic substrate, not shown) placed on a stage heated at 120° C., to form a silver nanowire layer 507.

Still further, the silver nanowire layer is bar-coated at room temperature with an ethanol dispersion of reduced-type graphene oxide in which polyethyleneimine chains are connected, and dried at 120° C. to form a graphene layer 508. Thus, an electrode layer 509 is formed.

The obtained layered stack is so placed on a stage heated at 100° C. that the layer 508 of polyethyleneimine chain-connected reduced-type graphene may be positioned at the top. Subsequently, the tin oxide buffer layer 506 is brought into contact with the graphene layer 508, then a metal roller is rolled thereon from the edge to press-bond them, and thereafter the peeling procedure is carried out so as to transfer the silver nanowire layer 507 and the graphene layer 508, namely, the electrode layer 509.

After that, the upper skin of the ITO is mechanically scribed according to the above formed strip-shaped ITO pattern. Successively, copper is sputtered so as to form a metal wiring layer 510 and thereby strip-shaped cells are wired in series.

The whole body is then coated with a thermosetting silicone resin and heated to form an insulating layer (not shown) of 40 μm thickness. Further, the insulating layer is screen-printed with UV-cut ink to form a UV-cut layer (not shown). Furthermore, the UV-cut layer is coated with silica by CVD to form a gas-barrier layer (not shown). Finally, the outer periphery is sealed, to produce a solar cell module.

The obtained solar cell module is semitransparent, and shows an energy-conversion efficiency of 4% or more when irradiated with pseudo-sunlight of 1 SUN. Even after the solar cell module is continuously irradiated with the pseudo-sunlight for 1000 hours at 60° C. in the atmospheric air, the efficiency thereof deteriorates only by 2% or less.

EXAMPLE 4

A solar cell which is transparent on one side is produced.

The surface of an ITO layer formed on a PET film is subjected to patterning with an acid, to form a strip-shaped transparent electrode. The electrode is coated with an ethanol dispersion of polyethyleneimine chain-connected reduced-type graphene oxide by means of a bar-coater, then further coated with an aqueous dispersion of graphene oxide, and thereafter dried at 120° C. for 10 minutes to form a barrier layer comprising a graphene layer.

The barrier graphene layer is coated with an aqueous solution of PEDOT·PSS by means of a bar-coater, and dried at 100° C. for 30 minutes to form a buffer layer (50 nm thickness) containing PEDOT·PSS.

Subsequently, the buffer layer is coated with a chlorobenzene solution containing P3HT and C60-PCBM by means of a bar-coater, and dried at 100° C. for 20 minutes, to form a photoelectric conversion layer.

Further, the photoelectric conversion layer is coated with an ethanol dispersion of tin oxide nanoparticles by means of a bar-coater, and dried to form a buffer layer.

Meanwhile, silver nanowires having a diameter of 30 nm are dispersed in 2-propanol, to prepare a 1 wt % dispersion. After a 10-cm square piece of PTFE film (hydrophobic substrate) of 100 μm thickness is placed on a stage heated at 60° C., the silver nanowire dispersion is held between the PTFE film and a columnar bar of 5 mm diameter (gap: 500 μm). The dispersion forms a meniscus between the PTFE film and the bar. The bar is then moved at a speed of 83 mm/second, to spread the silver nanowire dispersion.

The formed silver nanowire layer is then bar-coated at room temperature with a 2-propanol dispersion of graphite-exfoliated multilayer graphene.

The obtained layered stack is so placed on a stage heated at 50° C. that the above-formed graphene layer may be positioned at the top. Subsequently, the tin oxide buffer layer is brought into contact with the graphene layer, then a metal roller is rolled thereon from the edge to press-bond them, and thereafter the peeling procedure is carried out so as to transfer the silver nanowire layer and the graphene layer.

After that, the upper skin of the ITO is mechanically scribed according to the above formed strip-shaped pattern. Successively, copper is sputtered so as to form a metal wiring and thereby strip-shaped cells are wired in series.

Subsequently, the post-process is carried out in the same manner as that in Example 3, to produce a solar cell module which is transparent on one side. The obtained solar cell module shows an energy-conversion efficiency of 5% or more when irradiated with pseudo-sunlight of 1 SUN. Even after the solar cell module is continuously irradiated with pseudo-sunlight for 1000 hours at 60° C. in the atmospheric air, the efficiency thereof deteriorates only by 1% or less.

EXAMPLE 5

Figure 6:
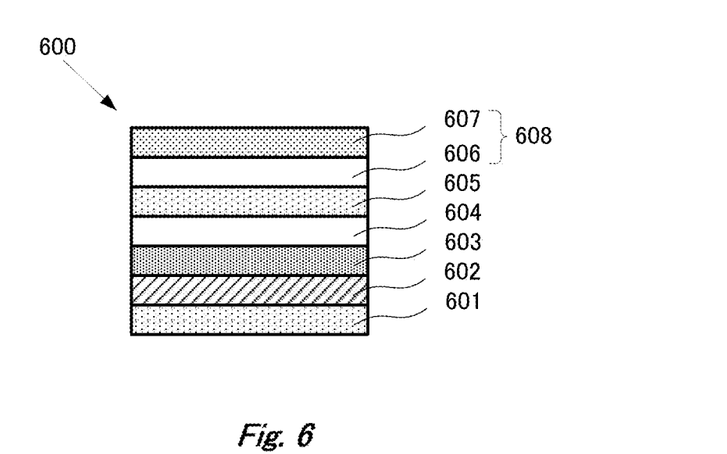
FIG. 6 is a schematic sectional view showing the structure of the organic EL device produced in Example 5.

A semitransparent organic EL device 600 shown in FIG. 6 is produced.

A layered transparent electrode 602 of ITO/silver alloy/ITO is formed on a PET film 601, and the surface of the electrode is coated with an ethanol dispersion of polyethyleneimine chain-connected reduced-type graphene oxide by means of a bar-coater, then further coated with an aqueous dispersion of graphene oxide, and thereafter dried at 120° C. for 10 minutes to form a barrier layer 603 comprising a graphene layer.

The barrier graphene layer is coated with an aqueous solution of PEDOT·PSS by means of a bar-coater, and dried at 100° C. for 30 minutes to form a buffer layer 604 (50 nm thickness) containing PEDOT·PSS.

On the buffer layer, N,N'-di-1-naphthyl-N,N'-diphenyl-1,1'-biphenyl-4,4'-diamine, which functions as a P-type semiconductor, is vapor-deposited to form a 30-nm thick layer. Successively, tris(8-hydroxyquinolinato)aluminum, which functions as both a luminous material and an N-type semiconductor, is vapor-deposited thereon to form a 40-nm thick layer. Thus, a photoelectric conversion layer 605 is produced.

Meanwhile, silver nanowires having a diameter of 30 nm are dispersed in 2-propanol, to prepare a 0.3 wt % dispersion. After a 10-cm square piece of PTFE film of 100 μm thickness is placed on a stage heated at 60° C., the silver nanowire dispersion is held between the PTFE film and a columnar bar of 5 mm diameter (gap: 500 μm). The dispersion forms a meniscus between the PTFE film and the bar. The bar is then moved at a speed of 8 mm/second, to spread the silver nanowire dispersion.

The formed silver nanowire layer is bar-coated at room temperature with an ethanol dispersion of polyethyleneimine chain-connected reduced-type graphene oxide, and then dried at 120° C. to form a graphene layer.

The obtained layered stack is so placed on a stage heated at 70° C. that the layer of polyethyleneimine chain-connected reduced-type graphene oxide may be positioned at the top surface. Subsequently, the photoelectric conversion layer 605 is brought into contact with the graphene layer, then a metal roller is rolled thereon from the edge to press-bond them, and thereafter the peeling procedure is carried out so as to transfer the graphene layer 606 and the silver nanowire layer 607 and thereby to form an electrode layer 608.

After that, aluminum is sputtered to form a metal auxiliary wiring layer (not shown).

Finally, the post-process is carried out in the same manner as that in Example 3, to produce a semitransparent organic EL device usable for illumination of windows and the like. Even after the obtained organic EL device continuously works for 1000 hours at 60° C. in the atmospheric air, the output power thereof deteriorates only by 2% or less.

EXAMPLE 6

Silver particles having an average particle size of 800 nm and polyvinylpyrrolidone are dispersed in ethanol to prepare a 1 wt % dispersion, which is then screen-printed on a 10-cm square piece of PTFE film of 100 μm thickness.

The formed silver particle layer is bar-coated at room temperature with a 2-propanol dispersion of graphite-exfoliated multilayer graphene, to form a graphene layer.

The formed graphene layer and a PET film of 100 μm thickness is stacked on a stage heated at 120° C., and then a metal roller is rolled thereon from the edge so as to directly press-bond them. Successively, the peeling procedure is carried out to transfer the silver particle layer and the graphene layer onto the PET film.

As a result, the silver particle layer and the graphene layer are almost completely transferred, to obtain an electrode having a surface resistance of 0.1Ω/square.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A process for producing an electrode, comprising the steps of:
    coating a hydrophobic substrate directly with a dispersion of metal nanomaterial, to form a metal nanomaterial layer,
    coating the surface of said metal nanomaterial layer with a dispersion of carbon material, to form a carbon material layer and thereby to form an electrode layer comprising a laminate of the metal nanomaterial layer and the carbon material layer,
    pressing said carbon material layer onto a hydrophilic substrate so that the surface of said carbon material layer may be directly fixed on the hydrophilic substrate, and
    peeling away said hydrophobic substrate so as to transfer said electrode layer onto said hydrophilic substrate.

2. The process according to claim 1, wherein said hydrophilic substrate is flexible.

3. The process according to claim 1, wherein said metal nanomaterial has a lower zeta potential than said hydrophobic substrate.

4. The process according to claim 1, wherein said metal nanomaterial is silver nanowires.

5. The process according to claim 1, wherein said hydrophobic substrate has a surface roughness of 0.2 μm or less.

6. The process according to claim 1, wherein said carbon material is graphene.

7. The process according to claim 1, wherein said carbon material is graphene in which polyethyleneimine chains are connected.

8. The process according to claim 1, wherein said carbon material is graphite-exfoliated graphene.

9. The process according to claim 1, wherein said hydrophobic substrate contains polytetrafluoroethylene.

10. The process according to claim 1, wherein a layer containing a third material is further formed on the carbon material layer.

11. The process according to claim 1, which further comprises a step of processing said electrode layer.

12. A process for producing a photoelectric conversion device having a first electrode, a second electrode and a photoelectric conversion layer sandwiched therebetween, comprising the steps of:
    preparing a composite in which said photoelectric conversion layer is formed on said second electrode,
    coating a hydrophobic substrate directly with a dispersion of metal nanomaterial, to form a metal nanomaterial layer,
    coating the surface of said metal nanomaterial layer with a dispersion of carbon material, to form a carbon material layer and thereby to form an electrode layer comprising a laminate of the metal nanomaterial layer and the carbon material layer,
    pressing said carbon material layer onto said photoelectric conversion layer so that the surface of said carbon material layer may be directly fixed on the photoelectric conversion layer, and
    peeling away said hydrophobic substrate so as to transfer said electrode layer onto said photoelectric conversion layer and thereby to form the first electrode layer.

13. The process according to claim 12, wherein said composite is flexible.

14. The process according to claim 12, wherein said metal nanomaterial has a lower zeta potential than said hydrophobic substrate.

15. The process according to claim 12, wherein said metal nanomaterial is silver nanowires.

16. The process according to claim 12, wherein said carbon material is graphene.

17. The process according to claim 12, wherein a layer containing a third material is further formed on the carbon material layer.

18. The process according to claim 12, which further comprises a step of processing said first electrode layer.

19. The process according to claim 12, wherein said photoelectric conversion device is an organic EL device.

20. The process according to claim 12, wherein said photoelectric conversion device is a solar cell.

* * * * *